(12) United States Patent
Yamaguchi et al.

(10) Patent No.: US 6,727,487 B2
(45) Date of Patent: Apr. 27, 2004

(54) CMOS IMAGE SENSOR

(75) Inventors: Susumu Yamaguchi, Hachioji (JP); Kazuo Tansho, Hachioji (JP); Yasushi Hoshino, Hachioji (JP); Masafumi Mizukami, Hachioji (JP); Oh-Bong Kwon, Ichon-shi (KR)

(73) Assignee: Konica Minolta Opto, INC, Tokyo (JP)

( * ) Notice: Subject to any disclaimer, the term of this patent is extended or adjusted under 35 U.S.C. 154(b) by 122 days.

(21) Appl. No.: 10/156,017

(22) Filed: May 29, 2002

(65) Prior Publication Data

US 2002/0195546 A1 Dec. 26, 2002

(30) Foreign Application Priority Data

May 31, 2001 (JP) ........................................ 2001-164020

(51) Int. Cl.$^7$ ................................................. H01L 27/00
(52) U.S. Cl. ................... 250/208.1; 250/226; 257/432; 348/273
(58) Field of Search ................... 250/208.1, 214.1, 250/226; 257/432; 348/273, 279, 280, 310

(56) References Cited

U.S. PATENT DOCUMENTS

| | | | | | |
|---|---|---|---|---|---|
| 6,040,591 | A | * | 3/2000 | Otsuka | 257/232 |
| 6,232,590 | B1 | * | 5/2001 | Baek | 250/208.1 |
| 6,274,917 | B1 | * | 8/2001 | Fan et al. | 257/432 |
| 6,395,576 | B1 | * | 5/2002 | Chang et al. | 438/70 |
| 6,586,811 | B2 | * | 7/2003 | Sekine | 257/432 |
| 6,587,147 | B1 | * | 7/2003 | Li | 348/340 |

* cited by examiner

Primary Examiner—David Porta
Assistant Examiner—Patrick J. Lee
(74) Attorney, Agent, or Firm—Finnegan, Henderson, Farabow, Garrett & Dunner, L.L.P.

(57) ABSTRACT

A CMOS image sensor comprising: a light receiving unit as a photoelectric conversion portion; a signal processing circuit unit; a first color filter layer array and a first microlens array layer, which are provided on an upper surface of the light receiving portion; and a second layer comprising at least one of a color filter layer and a microlens array layer, provided on a region of at least a portion of an upper surface of the signal processing circuit portion.

8 Claims, 1 Drawing Sheet

CMOS IMAGE SENSOR

BACKGROUND OF THE INVENTION

1. Field of the Invention

The present invention relates to a CMOS (complementary metal oxide semiconductor) image sensor, and more particularly to a CMOS image sensor adapted for an image pickup apparatus which can be installed in a cellular phone, a personal computer, or the like.

2. Description of Related Art

Recently, remarkable improvement of CPU performance, progress of image processing technology and the like have allowed to process digital image data easily. In particular, in the field of cellular phone or PDA (personal digital assistant), some types with a display which can display images appear on the market, and significant improvement of data transfer rate in radio communication may be expected in the near future. Accordingly, it is anticipated that transfer of image data between such types of cellular phones and PDAs are frequently carried out.

At present, after a subject image is converted to image data by a digital still camera or the like, transfer of such image data is carried out through internet by using a personal computer or the like. However, in order to transfer the image data in such a manner, both apparatuses, i.e., a digital still camera and a personal computer, are required. Lately, as an image input device of a mobile data terminal, a miniature camera module in which both an image pickup device and an optical lens system are mounted on a substrate, is proposed. Such a miniature camera module does not require to have a digital still camera nor a personal computer and enables picking up an image to send it to a person simply, by a cellular phone which can be carried around with ease.

Further, as an image pickup device for such a compact camera module, CMOS image sensors are given attention, in place of a conventional CCD sensor, for the following reason.

(1) CMOS image sensors can be fabricated by applying the present CMOS fabricating process for semiconductor devices such as photodiodes or the like, at low costs in comparison with CCD sensors.

(2) CMOS image sensors can be operated by a single power supply so that the power consumption for that can be restrained lower than that of CCD sensors.

(3) Signal processing circuits, e.g., a CMOS logic circuit, can be integrated in the sensor chip and therefore the CMOS image sensors can be miniaturized in comparison with CCD sensors.

However, in the case that the image pickup device and the optical lens system are mounted on a single substrate, the light receiving plane of the image pickup device has to be set at an in-focus position of the optical lens system optimally. Accordingly, adjustment for the purpose occurs a large problem. For example, when mounting the image pickup device and the optical lens system onto the same substrate, it is difficult to set the light receiving plane of the image pickup device at an in-focus position of the optical lens system optimally because of variation in thickness of the adhesive which is used for mounting the optical lens system onto the substrate and variation in size of the components. In order to improve the dimensional precision for setting the light receiving plane of the image pickup device at an in-focus position of the optical lens system, a high-precision setting technique or a separate mechanism for adjusting to obtain an in-focus state is required. Such a requirement increases the production costs.

Even when a CMOS image sensor is adopted instead of a CCD image sensor, the above-described problem arises similarly. Such a problem forms a large obstruction to producing a compact camera module at a low cost.

SUMMARY OF THE INVENTION

The present invention has been developed to resolve the above-described problem. An object of the invention is to provide a CMOS image sensor which is adapted for obtaining an image pickup device for a camera module and which can be produced at a low cost.

In accordance with one aspect of the invention, the CMOS image sensor comprising, a light receiving unit as a photoelectric converting device, and a signal processing circuit; further comprising:

a first layer comprising a color filter array and a microlens array layered thereon, which are provided on an upper surface of the light receiving unit; and a second layer comprising at least one of a color filter and a microlens array, provided in a region of at least a portion of an upper surface of the signal processing circuit.

Herein, the term "photoelectric converting device" means "a part comprising a plurality of pixels which are disposed in two-dimensions, each of the pixels having a photoelectric conversion element". Each of the pixels generates a signal charge corresponding to the intensity of light received by each pixel. For example, each pixel of a general CMOS image sensor comprises a photodiode which performs photoelectric conversion and a CMOS transistor which performs charge amplification and switching.

The "signal processing circuit" means "a circuit which comprises a driving circuit for driving the pixels in order, to obtain signal charges, an A/D converter for converting signal charges to digital signals, and a digital signal processing unit for forming image output signals by using the digital signals".

The "color filter" means "a filter which only allows light of specific color components to pass through. Typically, the color filter array provided on the light receiving unit comprises red, green and blue filters (primary color filters) or cyan, magenta and yellow filters (complementary color filters), which are arranged to correspond to pixels of the light receiving unit, respectively, to obtain color information. A color image can be obtained by composing the whole output signals from the pixels.

The "microlens array" means "a plurality of microlenses, each having a hemisphere shape, arranged on the photoelectric converting device in two-dimensions, to increase the amount of light entering photodiodes as the photoelectric conversion elements of the pixels.

Next, the function and effects in the case of abutting a lens supporting member against the CMOS image sensor will explained as follows.

When a lens supporting member (including a lens frame) which supports an optical lens as a photographic optical system, is held by a substrate, while abutting portions (legs) of the lens supporting member are abutted against the upper surface of the CMOS image sensor, not positioned to a substrate, it is not required to consider variations in thickness of the adhesive between the substrate and the CMOS image sensor nor variations in height from the substrate to the light receiving plane of the CMOS image sensor, so that positioning in the direction of the optical axis can be performed precisely and assembly for an image pickup apparatus can be performed with little effort. In particular, 1-chip CMOS image sensor comprising a light receiving unit and a signal processing circuit which are integrated in the same semiconductor chip, can have the signal processing circuit with a large area enough to abut a lens supporting member against, in the outside of the light receiving unit. According to the CMOS image sensor, it is possible to have a structure which enables abutting a lens supporting member thereto easily in comparison with a CCD image sensor. However, it is desirable to consider a possibility of destruction of the CMOS image sensor by abutting a lens supporting member thereto carelessly.

In the CMOS image sensor according to the first aspect of the invention, because a first layer comprising a color filter array and a microlens array layered thereon, are provided on an upper surface of the light receiving unit; and a second layer comprising at least one of a color filter and a microlens array, is provided in a region of at least a portion of an upper surface of the signal processing circuit, the CMOS image sensor enables abutting a lens supporting member thereto through the second layer. As a result, it is not required to consider the adverse effect of variations in thickness of the adhesive between the substrate and the CMOS image sensor and the like, and further it is possible to reduce the possibility of destruction or malfunction, of the CMOS image sensor by abutting. Further, such a CMOS image sensor enables obtaining a miniaturized image pickup device.

Preferably, the signal processing circuit includes a digital signal processing circuit and the second layer is formed in a region of an upper surface of digital signal processing circuit.

In case that a color filter is disposed as the second layer, the color filter preferably comprises one of blue, red and green color filters.

The second layer preferably comprises a structure to enable placing a lens supporting member for supporting an optical lens, thereon.

The light receiving unit and the signal processing circuit is preferably formed in the same semiconductor chip, and the light receiving unit is formed in an approximate central region of the semiconductor chip and the signal processing circuit is formed in a peripheral region thereof.

The region in which the second layer is provided comprises at least separated three small regions which surround the light receiving unit.

Such a structure enables abutting a lens supporting member onto the upper surface of the CMOS image sensor, stably.

The second layer may be provided to cover almost whole upper surface of the digital signal processing circuit.

DESCRIPTION OF THE PREFERRED EMBODIMENT

Hereinafter, an embodiment of the present invention will be explained with reference to the drawings.

Figure 1:
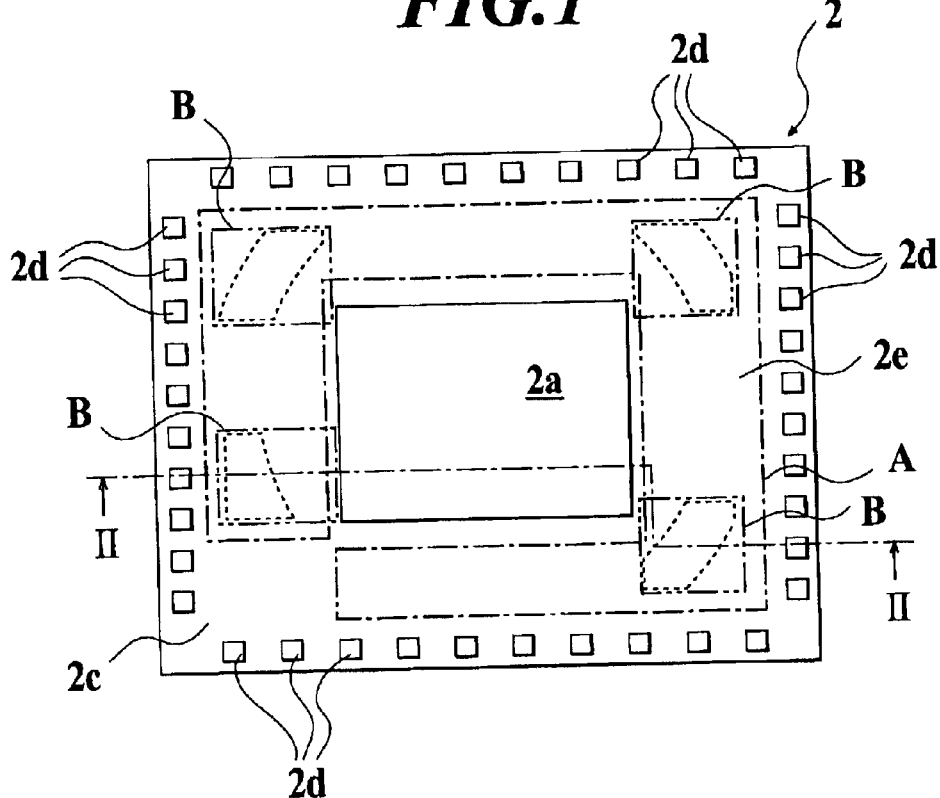
FIG. 1 is a plan view of a CMOS image sensor according to an embodiment of the invention.

In FIG. 1, CMOS image sensor 2 is provided with a light receiving unit 2a which functions as a photoelectric converting device, in approximately central region of the upper surface, and a signal processing circuit 2c in a peripheral region thereof. They are formed in the same semiconductor chip such as a silicon single crystal chip. The light receiving unit 2a has a large number of pixels (not shown) which are disposed in two-dimensions. Each pixel comprises a photodiode as a photoelectric conversion element, and a CMOS transistor which performs charge amplification and switching, to generate a signal charge corresponding to received light amount. The signal processing circuit 2c comprises a driving circuit for driving the pixels (photoelectric conversion elements) in order, to obtain signal charges, an A/D converter for converting signal charges to digital signals, and a signal processing unit for forming image output signals by using the digital signals, and the like. On the periphery of the upper surface of CMOS image sensor 2, in the vicinity of the outer ends of signal processing circuit 2c, a large number of pads 2d are arranged, as shown in FIG. 1.

Figure 2:
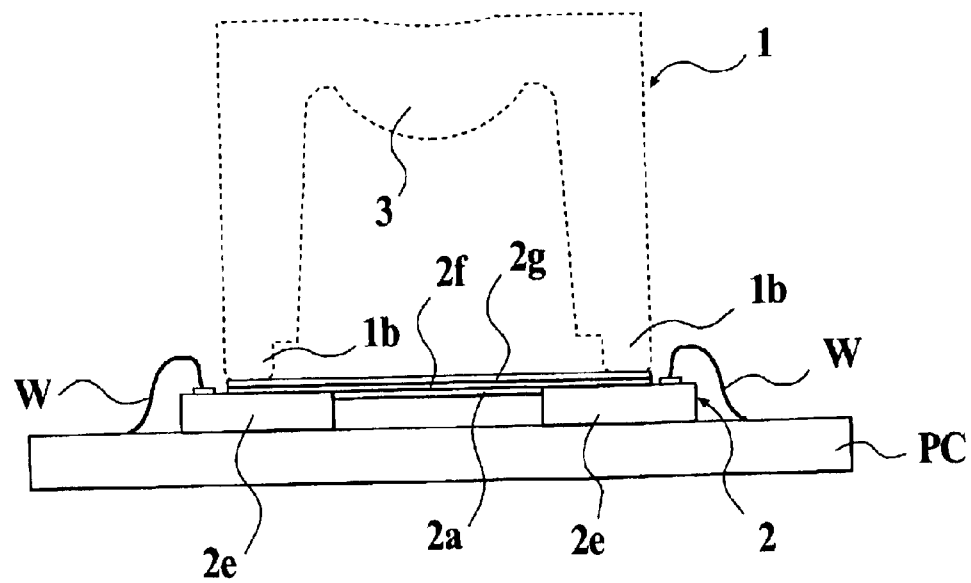
FIG. 2 is a vertical sectional view taken substantially along the lines II—II of FIG. 1, in the case that the CMOS image sensor shown in FIG. 1 is attached to a substrate.

CMOS image sensor 2 is adhered to fix at a predetermined position on the substrate PC, as shown in FIG. 2, and is electrically connected to a predetermined circuit on the substrate PC through pads 2d which are terminals for connecting and wires W.

On the upper surface of light receiving unit 2a, a color filter array 2f for forming color digital images is provided, and a microlens array 2g is layered on color filter array 2f, as shown in FIG. 2. Color filter array 2f and microlens array 2g constitute the first layer. Color filter array 2f comprises, for example, red, green and blue filters (three types of primary color filters), which are arranged to correspond to pixels of the light receiving unit 2a, respectively, by a photolithography technique and the like. Color images can be obtained by composing the whole output signals from the pixels.

Microlens array 2g comprises a plurality of hemisphere-shaped microlenses arranged in two-dimensions and is disposed on light receiving unit 2a through color filter array 2f to correspond to the pixels, respectively, to increase the amount of light entering the photodiodes as photoelectric conversion elements of the pixels. Such a microlens array can be fabricated by using a transparent synthetic resin material, a photolithography technique and a technique utilizing the heat fluidity of synthetic resin.

When color filter array 2f and microlens array 2g are formed on the upper surface of light receiving unit 2a, they are also formed on signal processing circuit 2c by the same process at the same time. Generally, although color filter array 2f and microlens array 2g, formed on light receiving unit 2a are kept, the color filter array and the microlens array, of the rest are removed in the production process. On the contrary, in the present embodiment of the invention, at least the color filter array and the microlens array on necessary regions (B), even of the rest, are left (the second layer), as described later. Such color filter array and microlens array constitute the second layer.

Abutting portions 1b of a lens supporting member 1 which supports an optical lens abuts onto the upper surface of CMOS image sensor 2. The reference numeral 3 denotes an optical lens. Next, the abutting points of abutting portions 1b of lens supporting member 1 will be studied, as follows.

In order to depress the surface pressure between abutting portions 1b of lens supporting member 1 and CMOS image sensor 2, a certain large abutting area for abutting portions 1b is required. As a place for abutting lens supporting member 1, the position of light receiving unit 2a of CMOS image sensor 2 is not proper because pixels for converting optical images to signal charges are disposed at the place, and the position of pads 2d in the region of signal processing circuit 2c surrounding light receiving unit 2a is also not proper because wire bonding is performed at the place.

On the contrary, there is a place with a broad area enough to abut the abutting portions 1b in the region of signal processing circuit 2c between pads 2d and light receiving unit 2a. In particular, digital signal processing circuit 2e in signal processing circuit 2c has higher abutting force resistance, i.e., higher pressure resistance. Accordingly, CMOS image sensor 2 according to the embodiment has a structure to enable abutting the abutting portion 1b of lens supporting member 1, in particular, on the upper surface of digital signal processing circuit 2e.

Proper place to be abutted, on the upper surface of CMOS image sensor 2 will be explained more concretely.

In CMOS image sensor 2 according to the embodiment, digital signal processing circuit 2e is arranged in an approximate C-shape when viewing from the top, i.e., region A shown by an alternate long and short dash line in FIG. 1. Therefore, the abutting portion 1b of lens supporting member 1 can be abutted against any place in region A. It is preferable that three, four or more abutting portions 1b are provided, in consideration of keeping a balance of lens supporting member 1 placed on digital signal processing circuit 2e. In the present embodiment shown in the drawings, four abutting portions 1b, like four legs, are provided.

Further, it is expected that provision of the second layer, that is, the color filter array and the microlens array, on the upper surface to be abutted, of digital signal processing circuit 2e gives a stress relaxation to digital signal processing circuit 2e. For this purpose, in CMOS image sensor 2 according to the embodiment, four rectangular shaped small regions B shown by an alternate long and two short dashes line in FIG. 1, in which the second layer comprising a color filter array and a microlens array layered thereon, are formed. The four abutting portions 1b which are shown by a dash line in FIG. 1, of lens supporting member 1 abut against the second layer in four rectangular shaped small regions B.

The color filter array and the microlens array layered thereon (second layer), may be kept to cover almost whole upper surface of the digital signal processing circuit 2e.

The second layer does not necessarily require both a color filter array and a microlens array layered thereon, on the signal processing circuit. The second layer may be constituted with only one of the color filter array and the microlens array. When a color filter is disposed on the upper surface of the signal processing circuit as the second layer, the color filter may be constituted by at least one of blue, red and green color filters.

The second layer does not necessarily require to be separated from the first layer.

In the present invention, although the color filter array and the microlens array on the upper surface of light receiving unit 2a, i.e., as the first layer, is required to have its inherent optical function, those on the upper surface of the signal processing circuit 2c, i.e., as the second layer, is not required to have its inherent optical function.

In the embodiment, because lens supporting member 1 can be attached to directly abut to the upper surface of the signal processing circuit 2c of CMOS image sensor, not onto the substrate PC, positioning of lens supporting member 1 with respect to light receiving unit 2a, in the direction of the optical axis can be performed accurately.

In order to stably abut and fasten lens supporting member 1 to signal processing circuit 2c of CMOS image sensor 2, various types of structures can be applied. For example, lens supporting member 1 abutting to signal processing circuit 2c of CMOS image sensor 2 can be fastened by pressing lens supporting member 1 down from the top by using an elastic pressing attachment member or the like, through an elastic member such as spring, which gives an appropriate biasing force to lens supporting member 1 in the direction of CMOS image sensor 2, and by engaging to fasten the elastic pressing attachment member to the substrate PC elastically.

Although the present invention has been explained according to the embodiment, it should also be understood that the present invention is not limited to the embodiment and that various changes and modifications may be made to the invention without departing from the gist thereof.

For example, in the above-described embodiment, electrical connection of CMOS image sensor 2 and the substrate PC is performed by using wires W. However, it can be performed also by wiring through the inside of CMOS image sensor 2 to output signals out of the rear surface or the side surface, of CMOS image sensor 2. According to such a structure, it is possible to conserve a broad region for signal processing circuit 2c of CMOS image sensor 2 and to carry out electrical connection easily. The image pickup device according to the invention can be incorporated into a digital camera, a cellular phone, a personal computer, a PDA, an audio and visual apparatus, a television, domestic appliances and the like.

The entire disclosure of Japanese Patent Application No. Tokugan 2001-164020 filed on May 31, 2001 including specification, claims, drawings and summary are incorporated herein by reference in its entirety.

What is claimed is:

1. A CMOS image sensor comprising, a light receiving unit as a photoelectric converting device, and a signal processing circuit; further comprising:
   a first layer comprising a color filter array and a microlens array layered thereon, which are provided on an upper surface of the light receiving unit; and
   a second layer comprising at least one of a color filter and a microlens array, provided in a region of at least a portion of an upper surface of the signal processing circuit.

2. The CMOS image sensor as claimed in claim 1, wherein the signal processing circuit comprises a digital signal processing circuit and the second layer is formed in a region of an upper surface of the digital signal processing circuit.

3. The CMOS image sensor as claimed in claim 1, wherein the second layer comprises a color filter which comprises one of blue, red and green color filters.

4. The CMOS image sensor as claimed in claim 1, wherein the second layer comprises a structure to enable supporting a lens supporting member for supporting an optical lens, thereon.

5. The CMOS image sensor as claimed in claim 1, wherein the light receiving unit is formed in an approximate central region of a semiconductor chip and the signal processing circuit is formed in a peripheral region thereof in the same semiconductor chip.

6. The CMOS image sensor as claimed in claim 5, wherein the region in which the second layer is provided comprises at least separated three small regions which surround the light receiving unit.

7. The CMOS image sensor as claimed in claim 2, wherein the second layer is provided to cover almost whole upper surface of the digital signal processing circuit.

8. A CMOS image sensor comprising:

a light receiving unit as a photoelectric converting device, comprising a plurality of pixels disposed in two-dimensions, each of which comprises a photoelectric conversion element and a CMOS transistor, to generate a signal charge corresponding to received light amount;

a signal processing circuit for processing the signal charge obtained from each of the pixels to form an image signal;

a first layer comprising a color filter array and a microlens array layered thereon, which are provided on an upper surface of the light receiving unit; and a second layer comprising at least one of a color filter and a microlens array, provided in a region of at least a portion of an upper surface of the signal processing circuit.

* * * * *

UNITED STATES PATENT AND TRADEMARK OFFICE
CERTIFICATE OF CORRECTION

PATENT NO. : 6,727,487 B2
DATED : April 27, 2004
INVENTOR(S) : Susumu Yamaguchi et al.

It is certified that error appears in the above-identified patent and that said Letters Patent is hereby corrected as shown below:

Title page,
Item [73], Assignee, after "Konica Minolta Opto, Inc., Tokyo, Japan", insert -- Hynix Semiconductor Inc., Ichon-shi, Korea --

Signed and Sealed this

Fourth Day of January, 2005

JON W. DUDAS
*Director of the United States Patent and Trademark Office*